United States Patent [19]
Lee

[11] Patent Number: 5,600,168
[45] Date of Patent: Feb. 4, 1997

[54] SEMICONDUCTOR ELEMENT AND METHOD FOR FABRICATING THE SAME

[75] Inventor: Bong J. Lee, Chungcheongbuk-do, Rep. of Korea

[73] Assignee: LG Semicon Co., Ltd., Seoul, Rep. of Korea

[21] Appl. No.: 510,874

[22] Filed: Aug. 3, 1995

Related U.S. Application Data

[63] Continuation of Ser. No. 230,337, Apr. 20, 1994, abandoned.

[51] Int. Cl.$^6$ .......................... H01L 29/76; H01L 21/265
[52] U.S. Cl. .......................... 257/336; 257/344; 257/365; 257/366; 257/412; 257/413; 257/900; 257/920; 437/21; 437/40; 437/43; 437/50; 437/189; 437/195; 437/225
[58] Field of Search .................................... 257/336, 344, 257/365, 366, 412, 413, 900, 920; 437/21, 40, 43, 50, 189, 195, 225

[56] References Cited

U.S. PATENT DOCUMENTS

| | | | |
|---|---|---|---|
| 5,027,185 | 6/1991 | Liauh | 257/413 |
| 5,047,816 | 9/1991 | Cuevas | 257/366 |

Primary Examiner—Edward Wojciechowicz
Attorney, Agent, or Firm—Morgan, Lewis and Bockius LLP

[57] ABSTRACT

This invention relates to MOS transistors and a method for fabricating the MOS transistors having LDD (Lightly Doped Drain) structures, which comprises a first conduction type semiconductor substrate, a second conduction type high density source and drain regions formed spaced from each other in the first conduction type semiconductor substrate, a second conduction type low density impurity region formed on sides facing each other of, and adjacent to the second conduction type high density source and drain regions, a first gate insulation film formed on both ends of a upper part of the semiconductor substrate region between the second conduction type low density impurity region, a second gate insulation film formed on upper part of the semiconductor substrate region between the first gate insulation films, a first conduction layer in a form of side wall spacer formed on the first gate insulation film, a second conduction layer formed on the second gate insulation film, a third conduction layer formed on the first conduction layer and the second conduction layer, insulation film side wall spacers formed on sides of the first conduction film and the third conduction layer, and a punch through prevention region formed in a semiconductor substrate region beneath the second gate insulation film.

16 Claims, 5 Drawing Sheets

SEMICONDUCTOR ELEMENT AND METHOD FOR FABRICATING THE SAME

This is a continuation of application Ser. No. 08/230,337 filed on Apr. 20, 1994 now abandoned.

FIELD OF THE INVENTION

This invention relates to semiconductor elements, and and a method for fabricating the semiconductor elements, more particularly to MOS transistors and a method for fabricating the MOS transistors having LDD__(Lightly Doped Drain) structures.

BACKGROUND OF THE INVENTION

In semiconductor integrated circuit fabrication, efforts for decreasing the size of an MOSFET__(Metal-Oxide-Semiconductor Field Effect Transistor) consisting a semiconductor integrated circuit has been continued to obtain a highly integrated semiconductor circuit having excellent function.

As the result of such efforts, the technique for fabricating a semiconductor integrated circuit has been scaled down to a level of sub-micron level.

Only with the scaling down of semiconductor elements in horizontal direction as well as in vertical direction (proportional to the scaling down in horizontal direction), various characteristics of the elements can be balance. That is, for example in transistors, when the size of an element is to be decreased, making the distance between a source and a drain closer, un-desirable characteristic deterioration of the element can develop, typically creating the short channel effect.

To solve the short channel effect, horizontal dimensions (length of a gate) as well as vertical dimensions (thickness of a gate insulation film, junction depth etc.,) should be decreased, and according to which, the applied voltage should be lowered, the doping concentration of the substrate should be made denser, and particularly the doping profile of the channel region should be adjusted.

However, because the applied voltage of an element should match the required voltage of an appliance, and because the required voltage applied on electronic appliances using semiconductor elements has not been decreased yet, though the size of semiconductor elements keep decreasing, a problem arises. In the case of semiconductor elements, particularly NMOS transistors have a structure susceptible to hot carrier problems developed by electrons applied from source and accelerated by a sudden high electric field near a drain due to the short channel effect generated because the distance between a source and a drain is closer.

According to Chenming Hu et al., "Hot Electron-Induced MOSFET Degradation Model, Monitor and Improvement," IEEE Transactions on Electron Devices, Vol. ED-32, No, 2, 1985 pp. 375 to 385, the cause of instability due to hot carrier problem is a very high electric field near a drain junction caused by the short channel length and the high applied voltage. Accordingly, an LDD structure, an improvement of an existing NMOS element structure having a short channel length and susceptible to hot carrier problems, was suggested.

The features of an LDD structure disclosed by a reference paper [K. Saito et al., "A New Short Channel MOSFET with lightly doped Drain" Denshi Tsushin Rengo Taikai, 1978, pp. 220] is that an N__ region (low density impurity region) having a narrow width and self-aligned makes the high electric field near the drain junction spread out, preventing carriers (electrons) applied from a source from being accelerated even when high voltages are applied, thereby solving the instability of elements caused by hot carrier problem.

As research continues on the fabrication of elements having more than 1M DRAM class integration, many technologies for fabrication of MOSFETs having LDD structures have been suggested, of which an LDD forming method utilizing gate side wall spacers is the most typical. That which technology is used as a mass-production technology in most cases, until now.

Referring to FIG. 1, a method for fabrication of MOSFETs having conventional LDD structures is to be explained hereinafter.

Figure 1A:
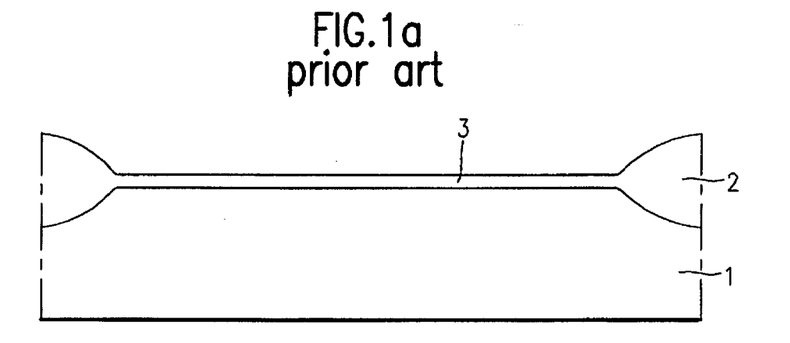
FIG. 1a–1e show a method for fabrication of a conventional MOS transistor having a LDD structure.

First, when an NMOS is to be formed, as shown in FIG. 1(a), a gate oxidation film 3 is formed by an oxidation process on a p-type semiconductor substrate 1 divided into an active region and an element separation region by a field oxidation film 2.

Figure 1B:
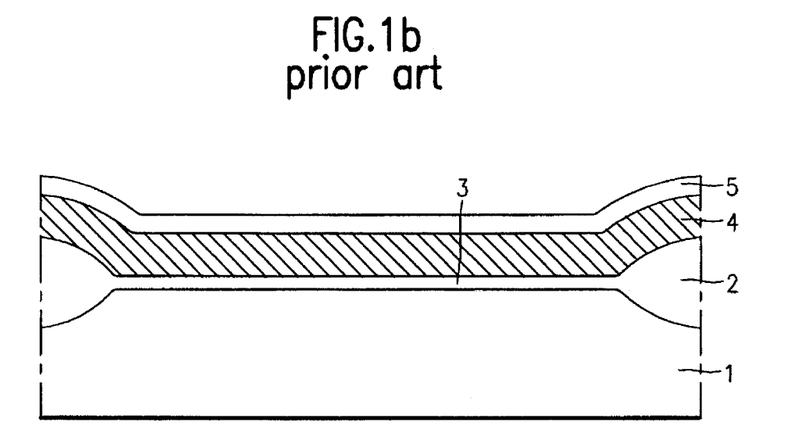

Then, as shown in FIG. 1(b), a polysilicon layer 4 is formed on the gate oxidation film 3 as a conduction layer for forming a gate pole. A gate cap oxidation film 5 is formed on polysilicon layer 4.

Figure 1C:
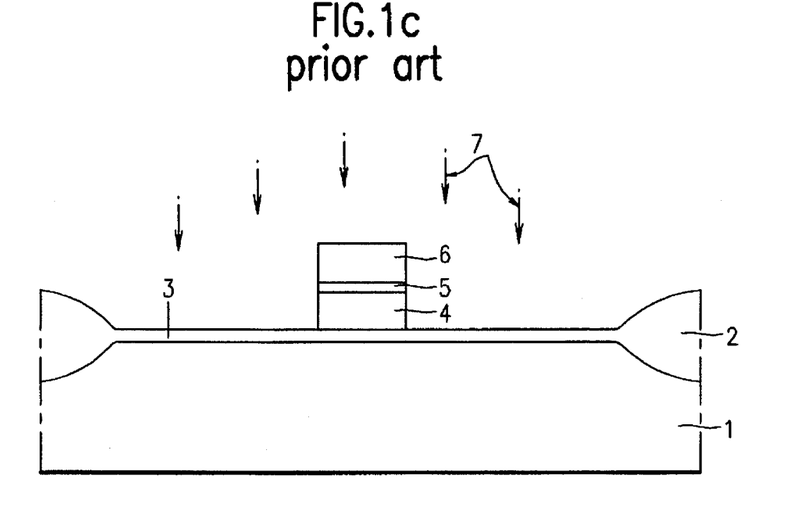
Figure 1D:
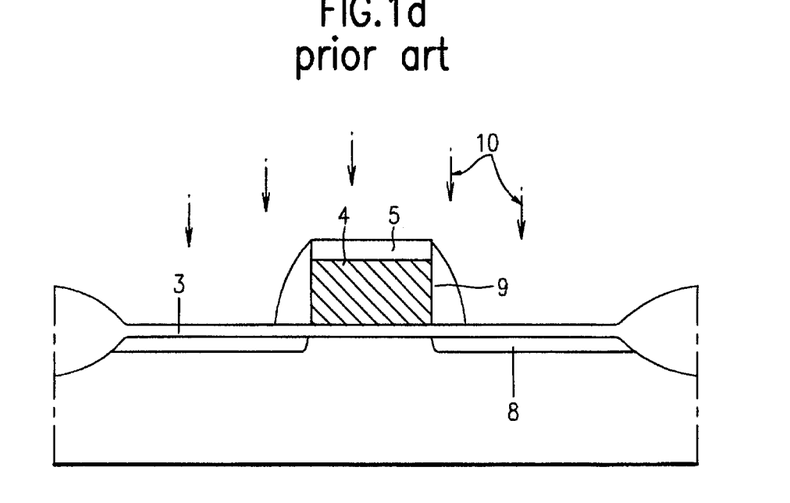
Figure 1E:
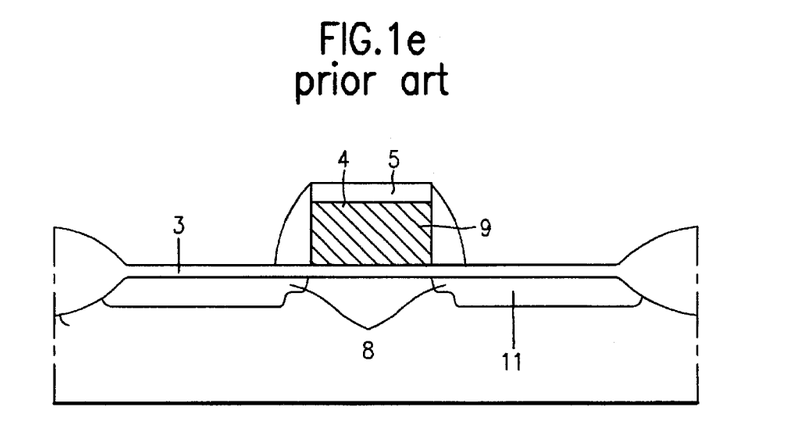

Next, as shown in FIG. 1(c), photo resist 6 is deposited on the gate cap oxidation film 5, which photo resist 6 is exposed and developed by a photo etching process to form a desired gate pole pattern 6. Using the photo resist pattern as a mask, the gate cap oxidation film 5 and the polysilicon layer 4 are etched. Then, as shown in FIG. 1(d), a low density impurity region (n-region) 8 is formed by ion injecting 7 n-type impurities in low density ( to E13/cm2). Then, after the photo resist pattern 6 is removed, an oxidation film is formed on all over the surface of the substrate by a chemical vapor deposition method, and etched back to form side wall oxidation film 9 on the sides of the gate pole. Thereafter, to form high density source and drain regions, n-type impurities are ion injected 10 in high density (to E15/cm2) forming n+ source and drain regions 11 as shown in FIG. 1(e).

With the foregoing MOSFETs having LDD structures, when the integration of elements is advanced further making the channel length very short, it is hard to improve the short channel effect in which the threshold voltage of transistors is dropped due to the side effect from the low density impurity region and the punch through between the source and drain.

Figure 2:
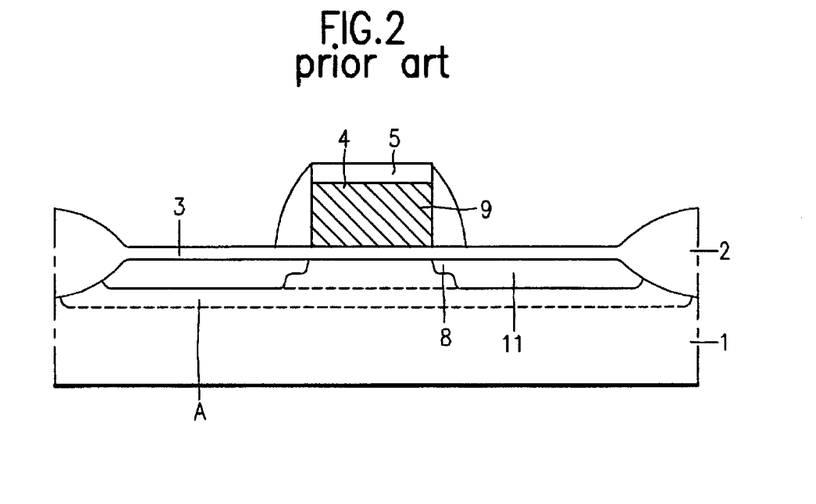
FIG. 2 shows a method for fabricating a conventional transistor having an improved LDD structure.

To overcome this problem, a MOSFET structure for preventing punch through between a source and a drain, includes a punch through prevention layer formed under the source and the drain as shown in FIG. 2.

The MOSFET having such a punch through prevention layer is formed by, in the foregoing MOSFET fabrication process of FIG. 1, after carrying out the process of FIG. 1(a), forming a punch through prevention layer A by ion injection into the substrate followed by the same processes shown in of FIG. 1(b) to FIG. 1(e).

However, the foregoing MOSFET structure has problems of increased parasitic capacitance and development of current leakage due to the direct contact of the punch through prevention layer formed for prevention of punch through between the source and the drain regions, with the high density source and drain regions.

SUMMARY OF THE INVENTION

The object of this invention for solving foregoing problems, is to provide a MOSFET structure and a method for fabrication of the MOSFET structure suitable for improving the short channel effect of the MOSFET having a short channel.

These and other objects and features of this invention can be achieved by providing a semiconductor element including a first conduction type semiconductor substrate, a second conduction type high density source and drain regions formed spaced from each other in the first conduction type semiconductor substrate, a second conduction type low density impurity regions formed on sides facing each other of and adjacent to the second conduction type high density source and drain regions, a first gate insulation films formed on both ends of a upper part of the semiconductor substrate region between the second conduction type low density impurity region, a second gate insulation film formed on upper part of the semiconductor substrate region between the first gate insulation films, a first conduction layer in a form of side wall spacer formed on the first gate insulation film, a second conduction layer formed on the second gate insulation film, a third conduction layer formed on the first conduction layer and the second conduction layer, insulation film side wall spacers formed on sides of the first conduction film and the third conduction layer, and a punch through prevention region formed in a semiconductor substrate region beneath the second gate insulation film, and by providing a method for fabricating a semiconductor element including processes for forming a buffer layer on a first conduction type semiconductor substrate, forming an insulation film on the buffer layer, coating photo resist on the insulation film, exposing and developing the photo resist selectively with photo etching process to leave the photo resist only on areas except an area a gate pole of the semiconductor substrate is to be forme herein, exposing a gate pole forming area by removing the insulation film and the buffer layer selectively using the photo resist as a mask, removing the photo resist, forming a first gate insulation film on the exposed semiconductor substrate area, forming a first conduction layer in a form of spacer on the side surfaces of the insulation film by carrying out deposition and etch back of conduction material on all over the surface of the first gate insulation film and the insulation film, forming a second gate insulation film on the semiconductor substrate area exposed by the etching of the first gate insulation film and on the first conduction layer, forming a punch through prevention region in the semiconductor substrate beneath the second gate insulation film by ion injection of a first conduction type impurities in low density, forming a second conduction layer on the second gate insulation film, forming a third conduction layer on top of the exposed first conduction layer and the second conduction layer, removing the insulation film and the buffer layer successively, forming a low density impurity region in a predetermined area of the semiconductor substrate by ion injecting a second conduction type impurities in low density, forming an insulation film spacer on the sides of the first conduction lay and the third conduction layer, and forming high density source and drain regions in predetermined areas of the semiconductor substrate by ion injection of the second conduction type impurities in high density.

DETAILED DESCRIPTION OF THE INVENTION

This invention will be explained in detail hereinafter, referring to the attached drawings.

Figure 3:
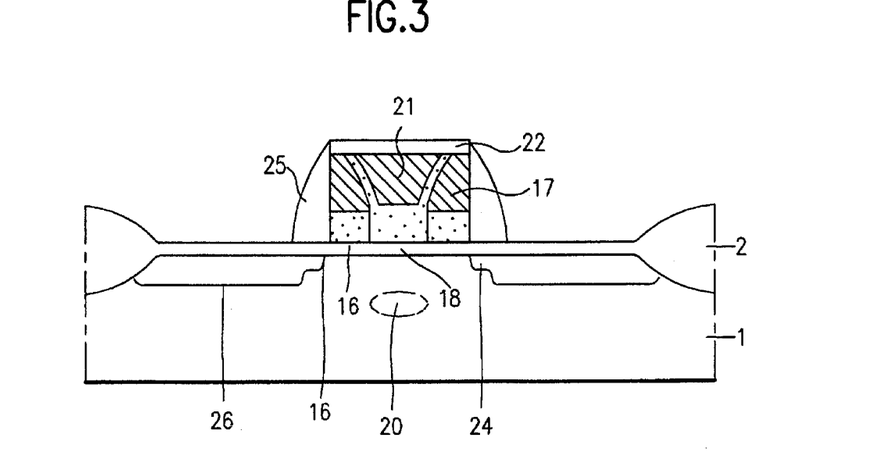
FIG. 3 shows a section of an MOS transistor having an LDD structure in accordance with one embodiment of this invention.

Shown in FIG. 3 is a MOSFET having an LDD structure in accordance with one embodiment of this invention.

As shown in FIG. 3, in the MOSFET in accordance with this invention, there are formed a second conduction type high density source and drain regions spaced apart from each other on a first conduction type semiconductor substrate 1, a second conduction type low density impurity regions 24 on facing sides, and adjacent to the high density source and drain regions, first gate insulation films 16 on both ends of upper part of the semiconductor substrate region between the low density impurity regions 24, a second gate insulation film 18 on the semiconductor substrate region between the ends of first gate insulation films 16, a first conduction layer 17 in a form of side wall spacer on the first gate insulation film 16, a second conduction layer 21 on the second gate insulation film 18 filling a space formed by and between the first conduction layers 17 of side wall spacers, forming a gate pole connecting the first conduction layer 17, the second conduction layer 21, and a third conduction layer 22 which is formed on the first conduction layer 17 and the second conduction layer 21, together. An insulation film side wall spacer 25 is formed on the sides of the first conduction layer 17 and the third conduction layer 22.

The first gate insulation film 16 and the second gate insulation film 18 having different thickness from each other, are used as gate insulation films together. Therefore the threshold voltage of a transistor can be made different because of the first gate oxidation film and the second oxidation film. That is, controlling the threshold voltage is made possible by varying the thickness of the second gate oxidation film 18. Therefore it is made possible to prevent threshold voltage drop in a transistor having a short channel.

A method for fabrication a MOSFET having the foregoing structure in accordance with this invention will be explained by, referring to FIG. 4.

Figure 4A:
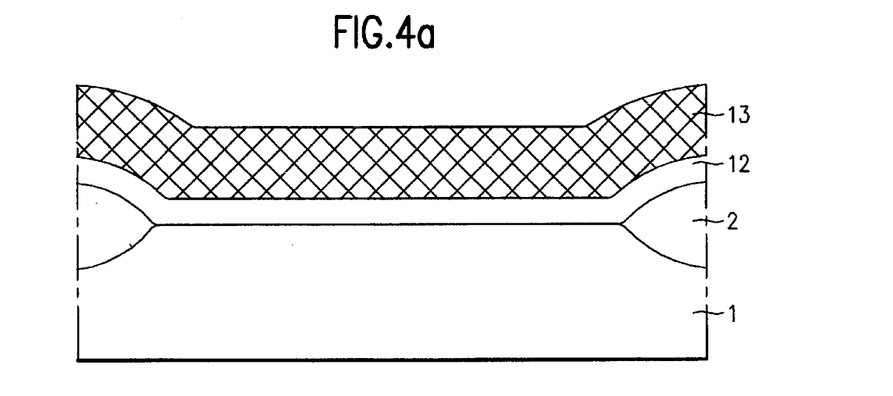
FIG. 4a–4h show a method for fabricating an MOS transistor having an LDD structure in accordance with one embodiment of this invention.

First, as shown in FIG. 4(a), field oxidation films 2 are formed in predetermined areas on, for example, a p-type semiconductor substrate 1 as a first conduction type semiconductor substrate to define an active area of a transistor is to be formed therein, and for example, a silicon nitride film 12 as a buffer layer is formed on the substrate by a chemical vapor deposition method, on which, for example, a silicon oxide film 13 as an insulation film is formed using a chemical vapor deposition method. The material of the insulation film is chosen to be of a material having etch selectivity in wet etching over a gate comprising a conduction material layer to be formed in the following process.

Figure 4B:
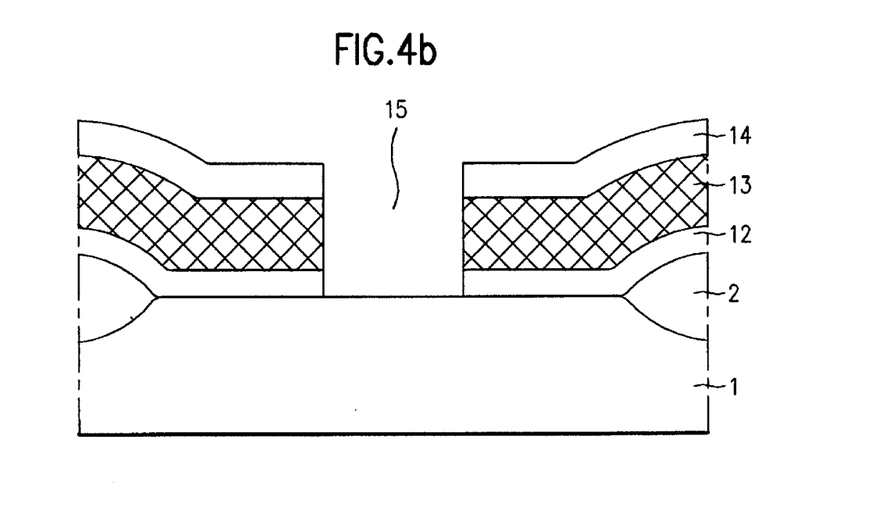

Then, as shown in FIG. 4(b), photo resist 14 is coated on the silicon oxide film 13, which film is selectively exposed and developed to leave photo resist only on areas except an area 15 where a gate pole is to be formed.

Then, the silicon oxide film 13 and the silicon nitride film 12 are etched successively by dry etching using the photo resist 14 as a mask exposing an area of the substrate where the gate pole is to be formed thereon.

Figure 4C:
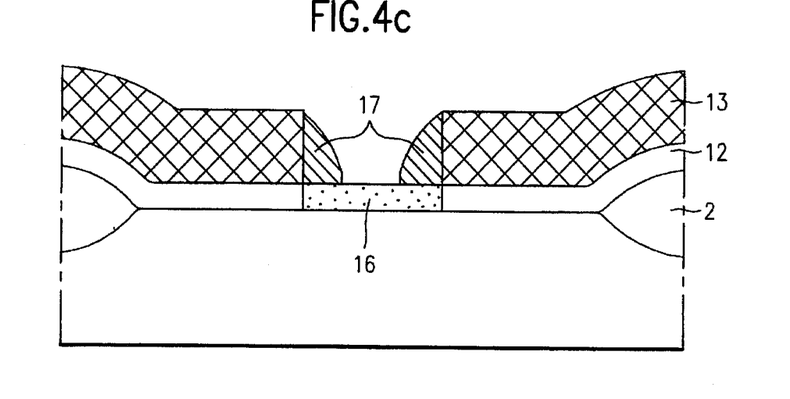

Next, as shown in FIG. 4(c), after removing the photo resist 14, a thermal oxidation process is carried out to form the first gate oxidation film 16 as a gate insulation film on the exposed substrate in the gate pole forming area.

Thereafter, for example, polysilicon as a conduction material is deposited on the first gate oxidation film 16 and the silicon oxide film 13 by a chemical vapor deposition method, which deposition is etched back to form first conduction layers 17 in a form of side wall spacers on the sides of the silicon oxide film 13.

Figure 4D:
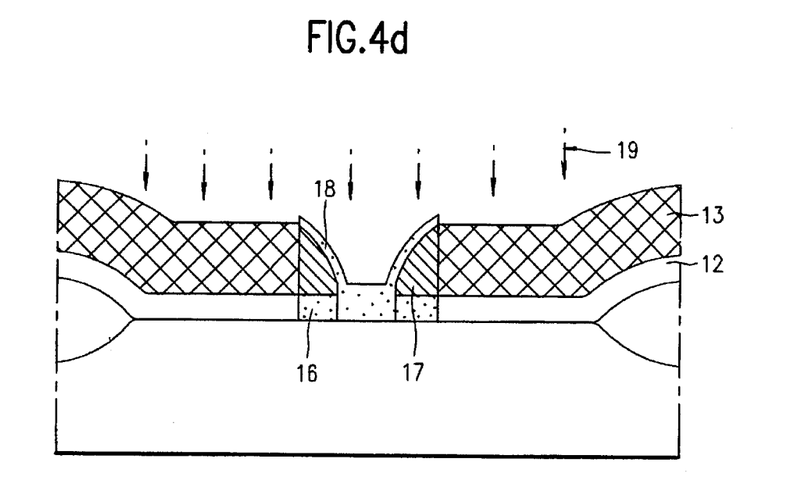

Then, as shown in FIG. 4(d), after carrying out a selective etching of the first gate oxidation film 16 using the silicon oxide film 13 and the first conduction layers 17 as a mask, a thermal oxidation process is performed to form a second gate oxidation film 18 as a gate insulation film on the substrate area exposed by the etching of the first gate oxidation film 16 and the first conduction layers 17. The second gate oxidation film 18 is formed thicker than the first gate oxidation film 16. As such, by providing the gate oxidation film with the first gate oxidation film 16 and the second oxidation film 18 having different thickness from each other, it is possible to have a different threshold voltage at each of the first gate oxidation film and the second oxidation film. That is, by controlling the thickness of the second gate oxidation film 18, controlling of the threshold voltage is made possible, thereby making prevention of threshold voltage drop in a transistor having a short channel possible.

Figure 4E:
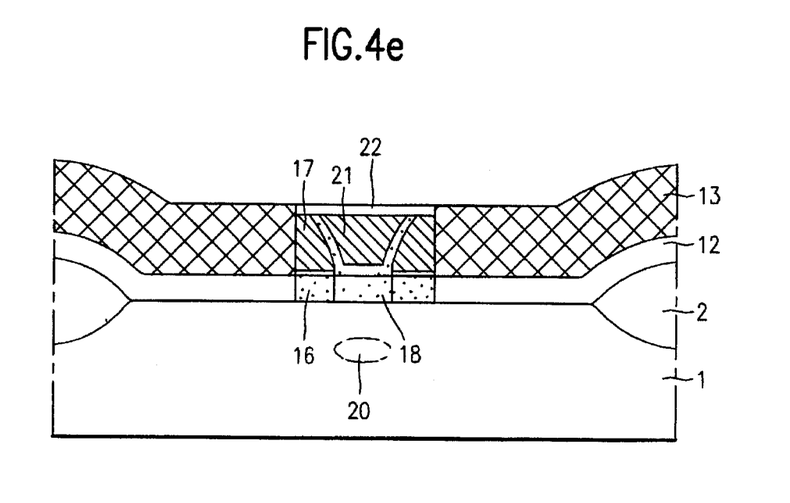

Then, in order to form a punch through prevention region 20 for improving the punch through effect between a source and a drain, p-type impurities as the first conduction type impurities is ion injected 19 in low density of about E12/cm2 to form a punch through prevention region 20 beneath the gate area as shown in FIG. 4(e).

Thereafter, for example, polysilicon as a conduction material is deposited on the second gate oxidation film 18 and the silicon oxide film 13, which is etched back to leave the polysilicon only in a recess on the second gate oxidation film 18 forming the second conduction layer 21, and upper part of the second gate oxidation film 18 is removed by subsequent etch back exposing upper part of the first conduction layers.

Then, as the third conduction layer, for example, a salicide (Self-aligned silicide) layer 22 is formed on the upper part of the exposed first conduction layers 17 and the exposed second conduction layer 21 making this salicide layer 22 electrically connect the first conduction layer 17 and the second conduction layer 21, thereby forming the gate pole including of the first conduction layers 17, the second conduction layer 21 and the third conduction layer 22.

The third conduction layer of the salicide layer 22, as evident, is not formed on an insulation film of the silicon oxide film 13, but is formed self-aligned only on conduction materials of the first conduction layers 17 and the second conduction layer 21 as shown in FIG. 4(e).

Figure 4F:
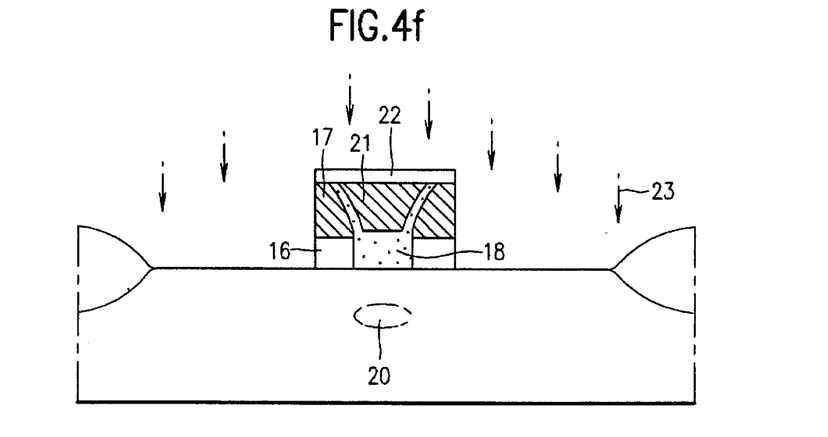

Then, as shown in FIG. 4(f), the silicon oxide film 13 and the silicon nitride film 12 are removed successively by wet etching. The silicon nitride film 12 serves to prevent the field oxidation film 2 from being etched at the time of etching of the silicon oxide film 13.

Figure 4G:
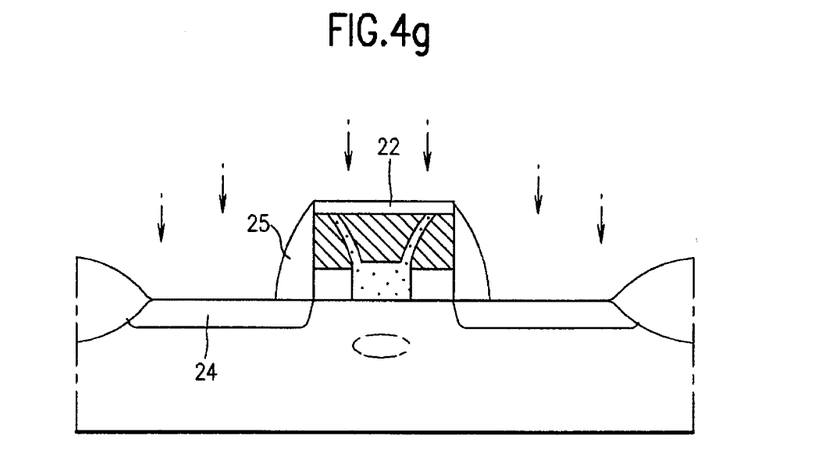
Figure 4H:
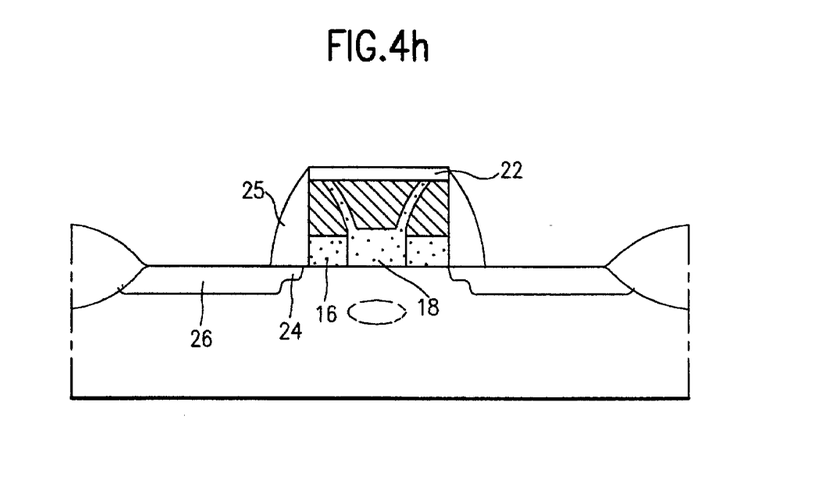

Thereafter, n-type impurities as the second conduction type impurities are ion injected 23 in low density of about E13/cm2 to form a low density impurity region(n-region) 24 as shown in FIG. 4(g). Then, for example, a silicon oxide film as an insulation film is deposited on the substrate by a chemical vapor deposition method, which is etched back to form the gate pole side wall spacers 25, followed by subsequent ion injection of n-type impurities as the second conduction type impurities in high density of E15/cm2 forming the high density source and drain regions 26 as shown in FIG. 4(h).

Though in the foregoing embodiment, case of NMOS transistors has been explained, it is of course possible to apply this invention to the fabrication of PMOS transistors.

In case of a PMOS transistor, n-type impurities are injected in low density of about E12/cm2 at the time of ion injection for forming a punch through prevention region using n-type semiconductor substrate, p-type impurities are ion injected in low density of about E13/cm2 at the time of forming a low density impurity region, and p-type impurities is ion injected in high density of about E15/cm2 at the time of forming high density source and drain regions.

The other processes are the same with the fabrication processes of the foregoing NMOS fabrication processes.

As can be seen from foregoing description, this invention can provide, in an MOS transistor having a short gate channel, different threshold voltage values of the parts of the first gate oxidation film and the second gate oxidation film from each other by making gate oxidation films of the first gate oxidation films at both ends of the gate and the second gate oxidation film at the center of the gate to be formed to have different thicknesses with respect to each other. Accordingly, as controlling the thickness of the second gate oxidation film at the center of the gate to be thicker than the first gate oxidation film, controlling of the second gate oxidation film thickness to control the threshold voltage is made possible. The whereby short channel effect in which threshold voltage drops as the channel length becomes shorter is improved even in transistors having short channels.

And, since the punch through prevention region is formed only beneath the gate i.e., beneath the second gate oxidation film preventing direct contact of the high density source and drain regions with the punch through region, it is possible to decrease the parasitic capacitance.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A semiconductor element comprising:

a first conductivity-type semiconductor substrate;

second conductivity-type high-density source and drain regions formed spaced from each other in the semiconductor substrate;

a second conductivity-type low-density impurity region formed adjacent to the second conductivity-type high-density source and drain regions;

pair of first gate insulation films formed on both ends of the semiconductor substrate between the second conductivity-type low-density impurity region;

a second gate insulation film formed on the semiconductor substrate between the pair of first gate insulation films;

a pair of first conduction layers in the form of a sidewall spacer formed directly above the first gate insulation films;

a second conduction layer formed on the second gate insulation film;

a third conduction layer connecting the pair of first conduction layers and the second conduction layer so as to form a single gate;

an insulation film sidewall spacer in contact with one of the pair of first gate insulation films and the first and one of the pair third conduction layers; and a punch through prevention impurity region formed in the semiconductor substrate beneath the second conduction layer.

2. The semiconductor element as claimed in claim 1, wherein the first gate insulation films and the second gate insulation film have different thicknesses.

3. The semiconductor element as claimed in claim 1, wherein the second gate insulation film is thicker than each of the first gate insulation films.

4. The semiconductor element as claimed in claim 1, wherein the second gate insulation film is formed on an upper part of the semiconductor substrate between the first gate insulation films and on the first conduction layers.

5. The semiconductor element as claimed in claim 1, wherein the third conduction layer is formed of salicide.

6. A method for fabricating a semiconductor element, comprising the steps of:

forming a buffer layer on a first conductivity-type semiconductor substrate;

forming an insulation film on the buffer layer;

coating photoresist on the insulation film;

exposing a gate pole forming area by removing the insulation film and the buffer layer selectively using the photoresist as a mask;

removing the photoresist;

forming a first gate insulation film on the exposed semiconductor substrate area;

forming a first conduction layer in the form of a sidewall directly above the first gate insulation film by carrying out deposition and etch back of conduction material on all over the surface of the first gate insulation film and the insulation film;

forming a second gate insulation film on the semiconductor substrate area exposed by the etching of the first gate insulation film and on the first conduction layer;

forming a punch-through prevention region in the semiconductor substrate beneath the second gate insulation film by ion injection of first conductivity-type impurities in low density;

forming a second conduction layer on the second gate insulation film;

forming a third conduction layer on top of the exposed first conduction layer and the second conduction layer;

removing the insulation film and the buffer layer successively;

forming a low-density impurity region in a predetermined area of the semiconductor substrate by ion injecting second conductivity-type impurities in low density;

forming an insulation sidewall spacer in contact with the first gate insulation film and the first and third conduction layers; and forming high density source and drain regions in predetermined areas of the semiconductor substrate by ion injection of second conductivity-type impurities in high density.

7. The method as claimed in claim 6, wherein the buffer layer is formed of a silicon oxide film.

8. The method as claimed in claim 6, wherein the insulation film is formed of a material having an etch selectivity over the first conduction layer, the second conduction layer and the third conduction layer.

9. The method as claimed in claim 6, wherein the insulation film comprises a silicon oxide film.

10. The method as claimed in claim 6, wherein the first gate insulation film is formed by a thermal oxidation process.

11. The method as claimed in claim 6, wherein the first conduction layer is formed of polysilicon.

12. The method as claimed in claim 6, wherein the second gate insulation film is formed by a thermal oxidation process.

13. The method as claimed in claim 6, wherein the second conduction layer is formed of polysilicon.

14. The method as claimed in claim 6, wherein the third conduction layer is formed of salicide.

15. A semiconductor element comprising:

a first conductivity-type substrate;

a first gate insulation film formed on the substrate;

a pair of first conduction layers formed including two opposite sidewall spacers directly above the first gate insulation film;

a second gate insulation film formed on the first conduction layer;

a second conduction layer formed on the second gate insulation film;

a third conduction layer connecting the first and second conduction layers so as to form a single gate;

a punch through prevention impurity region formed in the semiconductor substrate beneath the second conduction layer; and a pair of insulation sidewall spacer including two opposite sidewall spacers at the sidewall of the first gate insulation film, the first conduction layer and the third conduction layer; and second conductivity-type source and drain regions formed in the substrate adjacent to the insulation sidewall spacer.

16. A semiconductor device comprising:

a substrate;

a source region in the substrate;

a drain region in the substrate spaced from the drain region;

a pair of first gate insulation films on respective ends of the substrate between the source and drain regions;

a second gate insulation film on the substrate disposed between the pair of first gate insulation films;

a pair of first conduction layers on the pair of first gate insulation films;

a second conduction layer on the second gate insulation film; and a third conduction layer connecting the first conduction layers and the second conduction layer.

\* \* \* \* \*

UNITED STATES PATENT AND TRADEMARK OFFICE
CERTIFICATE OF CORRECTION

PATENT NO. : 5,600,168
DATED : February 4, 1997
INVENTOR(S) : Bong Jae LEE

It is certified that error appears in the above-indentified patent and that said Letters Patent is hereby corrected as shown below:

Column 1, line 12, delete extra underscore.
line 28, "balance" should be --balanced--.
line 66, delete extra underscore.

Column 3, line 33, "forme" should be --formed--.

Column 5, line 11, "which" should be --in which--.
line 50, "connect the" should be --connect to the--.

Column 6, line 61, "pair" should be --a pair--.

Column 7, line 12, "pair third" should be --pair of third--.

Signed and Sealed this

Twenty-eighth Day of April, 1998

Attest:

BRUCE LEHMAN

Attesting Officer

Commissioner of Patents and Trademarks